(12) United States Patent
Yoon

(10) Patent No.: US 7,176,825 B2
(45) Date of Patent: Feb. 13, 2007

(54) DATA-CONVERTING CIRCUIT, DATA-CONVERTING METHOD, AND DIGITAL-TO-ANALOG CONVERTER USING THE SAME

(75) Inventor: Hong-Goo Yoon, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/322,422

(22) Filed: Jan. 3, 2006

(65) Prior Publication Data

US 2006/0145903 A1   Jul. 6, 2006

(30) Foreign Application Priority Data

Jan. 3, 2005   (KR) ...................... 10-2005-0000235

(51) Int. Cl.
    *H03M 1/83*   (2006.01)
(52) U.S. Cl. ...................................... 341/153; 341/144
(58) Field of Classification Search ......... 341/130–172
    See application file for complete search history.

(56) References Cited

U.S. PATENT DOCUMENTS 5,640,162 A  *  6/1997  Lewyn ....................... 341/144

6,351,428 B2     2/2002  Forbes
6,617,986 B2  *  9/2003  Connor et al. .............. 341/159
6,965,331 B2  * 11/2005  Demartini et al. ............ 341/96

FOREIGN PATENT DOCUMENTS

| JP | 02-026130 | 1/1990 |
| JP | 02-147607 | 6/1990 |
| JP | 07-066732 | 3/1995 |

* cited by examiner

*Primary Examiner*—Rexford Barnie
*Assistant Examiner*—Lam T. Mai
(74) *Attorney, Agent, or Firm*—Volentine & Whitt, P.L.L.C.

(57) ABSTRACT

A data converting method is realized by a data-converting circuit including: a data combining circuit for outputting $1^{st}$ through $(2^n-1)^{th}$ intermediate data bits by combining data bits corresponding to "1"s in n-bit binary data corresponding to a decimal number; a thermometer code generating circuit for generating $1^{st}$ through $(2^n-1)^{th}$ bits of thermometer code data each activated as "1" when a corresponding intermediate data bit among the $1^{st}$ through $(2^n-1)^{th}$ intermediate data bits are activated, wherein each of the $1^{st}$ through $(2^n-1)^{th}$ bits of thermometer code data is additionally activated as "1" by the $1^{st}$ through $(2^n-1)^{th}$ intermediate data bits activated by binary data having a greater value than binary data activating the corresponding intermediate data bit; and a reset circuit for periodically resetting the $1^{st}$ through $(2^n-1)^{th}$ bits of thermometer code data to "0" in response to an external clock signal. A digital-to-analog converter incorporates the data-converting circuit.

28 Claims, 9 Drawing Sheets

DATA-CONVERTING CIRCUIT, DATA-CONVERTING METHOD, AND DIGITAL-TO-ANALOG CONVERTER USING THE SAME

TABLE 1

| | Binary Code | | | | Thermometer Code | | | | | | | | | | | | | | |
| --- | --- | --- | --- | --- | --- | --- | --- | --- | --- | --- | --- | --- | --- | --- | --- | --- | --- | --- | --- |
| Decimal Number | MSB A3 | A2 | A1 | LSB A0 | LSB T1 | T2 | T3 | T4 | T5 | T6 | T7 | T8 | T9 | T10 | T11 | T12 | T13 | T14 | MSB T15 |
| 1 | 0 | 0 | 0 | 1 | 1 | 0 | 0 | 0 | 0 | 0 | 0 | 0 | 0 | 0 | 0 | 0 | 0 | 0 | 0 |
| 2 | 0 | 0 | 1 | 0 | 1 | 1 | 0 | 0 | 0 | 0 | 0 | 0 | 0 | 0 | 0 | 0 | 0 | 0 | 0 |
| 3 | 0 | 0 | 1 | 1 | 1 | 1 | 1 | 0 | 0 | 0 | 0 | 0 | 0 | 0 | 0 | 0 | 0 | 0 | 0 |
| 4 | 0 | 1 | 0 | 0 | 1 | 1 | 1 | 1 | 0 | 0 | 0 | 0 | 0 | 0 | 0 | 0 | 0 | 0 | 0 |
| 5 | 0 | 1 | 0 | 1 | 1 | 1 | 1 | 1 | 1 | 0 | 0 | 0 | 0 | 0 | 0 | 0 | 0 | 0 | 0 |
| 6 | 0 | 1 | 1 | 0 | 1 | 1 | 1 | 1 | 1 | 1 | 0 | 0 | 0 | 0 | 0 | 0 | 0 | 0 | 0 |
| 7 | 0 | 1 | 1 | 1 | 1 | 1 | 1 | 1 | 1 | 1 | 1 | 0 | 0 | 0 | 0 | 0 | 0 | 0 | 0 |
| 8 | 1 | 0 | 0 | 0 | 1 | 1 | 1 | 1 | 1 | 1 | 1 | 1 | 0 | 0 | 0 | 0 | 0 | 0 | 0 |
| 9 | 1 | 0 | 0 | 1 | 1 | 1 | 1 | 1 | 1 | 1 | 1 | 1 | 1 | 0 | 0 | 0 | 0 | 0 | 0 |
| 10 | 1 | 0 | 1 | 0 | 1 | 1 | 1 | 1 | 1 | 1 | 1 | 1 | 1 | 1 | 0 | 0 | 0 | 0 | 0 |
| 11 | 1 | 0 | 1 | 1 | 1 | 1 | 1 | 1 | 1 | 1 | 1 | 1 | 1 | 1 | 1 | 0 | 0 | 0 | 0 |
| 12 | 1 | 1 | 0 | 0 | 1 | 1 | 1 | 1 | 1 | 1 | 1 | 1 | 1 | 1 | 1 | 1 | 0 | 0 | 0 |
| 13 | 1 | 1 | 0 | 1 | 1 | 1 | 1 | 1 | 1 | 1 | 1 | 1 | 1 | 1 | 1 | 1 | 1 | 0 | 0 |
| 14 | 1 | 1 | 1 | 0 | 1 | 1 | 1 | 1 | 1 | 1 | 1 | 1 | 1 | 1 | 1 | 1 | 1 | 1 | 0 |
| 15 | 1 | 1 | 1 | 1 | 1 | 1 | 1 | 1 | 1 | 1 | 1 | 1 | 1 | 1 | 1 | 1 | 1 | 1 | 1 |

CROSS-REFERENCE TO RELATED APPLICATION

This application claims the benefit of Korean Patent Application No. 10-2005-0000235, filed Jan. 3, 2005, the disclosure of which is hereby incorporated herein by reference in its entirety for all purposes as if fully set forth herein.

BACKGROUND OF THE INVENTION

1. Field of the Invention

The present invention relates to a data-converting circuit, and more particularly, to a data-converting circuit and method, and a digital-to-analog converter using the same, in which binary code digital data is converted into thermometer code type data.

2. Description of the Related Art

A digital-to-analog converter receives binary code digital data (hereinafter, referred to as "binary data") and outputs an analog value corresponding to the binary data. The binary data is generally converted into thermometer code type data (hereinafter, referred to as "thermometer code data"), and then an analog value is output corresponding to the thermometer code data. Here, the thermometer code indicates that a digital signal having a bit string of "0"s and a digital signal having a bit string of "1"s are arranged opposite to each other. For example, the thermometer code indicates a digital signal having a bit string of "000 . . . 0011 . . . 11". For reference, when the binary data has n bits, the thermometer code data has $(2^n-1)$ bits.

In a conventional data-converting circuit for converting the binary data into the thermometer code data, a logical expression for each bit of the thermometer code data is minimized using a Karnaugh map, a tabular method (or the Quine-McClusky method), or the like. That is, only logic gates are employed in a circuit for generating each bit of the thermometer code data.

However, the conventional data-converting circuit requires a large number of logic gates to generate the thermometer code data, and consequently occupies a large layout area and has a slow operating speed. Further, when the binary data includes a large number of bits, the circuit for generating bits of the thermometer code data should be redesigned and it is difficult to simplify the logical expression.

Table 1 shows Truth Table for converting binary data to thermometer code data. Here, "A0" through "A3" represent each bit of the binary data, "T1" through "T15" represent each bit of the thermometer code data. The decimal numbers in Table 1 represent decimal value obtained by converting binary data into decimal data.

Referring to Table 1, the relationship between each bit of the thermometer code data and the binary data is as follows.

The least significant bit (LSB) of the thermometer code data, i.e., the $1^{st}$ bit T1 of the thermometer code data is coded into "1" when the decimal number corresponding to the binary data is equal to or larger than "1". Further, the $2^{nd}$ bit T2 of the thermometer code data is coded into "1" when the decimal number corresponding to the binary data is equal to or larger than "2". Likewise, the $n^{th}$ bit Tn of the thermometer code data is coded into "1" when the decimal number corresponding to the binary data is equal to or larger than "n".

FIG. 1 is a block diagram of a conventional data-converting circuit. As shown in FIG. 1, the data-converting circuit includes a first converter 10 and a second converter 20. In FIG. 1, "A0" through "A3" indicate the bits of the binary data, and "T1" through "T15" indicate the bits of the thermometer code data.

The first and second converters 10 and 20 shown in FIG. 1 operate as follows.

The first converter 10 includes a plurality of inverters and outputs inverted binary data A0b through A3b and re-inverted binary data A0bb through A3bb in response to the binary data A0 through A3. Here, the inverted binary data A0b through A3b is obtained by inverting the binary data A0 through A3, and the re-inverted binary data A0bb through A3bb is obtained by inverting the inverted binary data A0b through A3b.

The second converter 20 includes a plurality of logic gates and outputs the thermometer code data T1 through T15 in response to the inverted binary data A0b through A3b and the re-inverted binary data A0bb through A3bb.

FIG. 2 is a circuit diagram showing an exemplary embodiment of a second converter 20 of the conventional data-converting circuit of FIG. 1. As shown in FIG. 2, the second converter 20 includes fifteen sub-circuits 20-1 through 20-15 to output each bit T1 through T15 of the thermometer code data. Here, each of sub-circuits 20-1 through 20-15 includes a combination of the logic gates, including inverters.

The sub-circuits shown in FIG. 2 operate as follows.

The sub-circuits 20-1 through 20-15 use some signals of the inverted binary data A0b through A3b and the re-inverted binary data A0bb through A3bb to output the bits T1 through T15 of the thermometer code data. For example, the sub-circuit 20-1 uses "A0b", "A1b" and "A2b" among the inverted binary data and "A3bb" among the re-inverted binary data, and outputs the $1^{st\ bit}$ $T1$ of the thermometer code data having a value of "1" when one or more of the bits A0 through A3 of the binary data is "1".

The other sub-circuits 20-2 through 20-15 operate in the same manner.

Referring to Table 1 and FIG. 2, the conventional data-converting circuit is designed as follows.

As described above, the conventional data-converting circuit is realized as an optimum logic circuit for each bit T1 through T15 of the thermometer code data, using the Karnaugh map, the tabular method, etc. on the basis of Table 1.

For example, the $1^{st}$ bit T1 of the thermometer code data is output as "1" when any one or more of the bits A0 through A3 of the binary data is "1". This can be seen by referring to Table 1 (or when the logic expression is simplified by the Karnaugh map or the tabular method). Therefore, as shown in FIG. 2, the sub-circuit 20-1 outputting the $1^{st}$ bit T1 of the thermometer code data performs a NAND operation on some bits A0b, A1b, and A2b of the binary data using a NAND gate, performs a NOR operation on the output signal of the NAND gate and the fourth bit A3bb of the re-inverted binary data using a NOR gate, and inverts the output signal of the NOR gate again using an odd number of inverters to thereby output the $1^{st}$ bit T1 of the thermometer code data.

The other sub-circuits 20-2 through 20-15 operate in the same manner.

However, in the conventional data-converting circuit, the number of sub-circuits to be designed increases exponentially as the number of bits of the binary data increases. Therefore, the design of the data-converting circuit becomes complicated as the number of bits of the binary data increases. Further, because numerous logic gates are employed in outputting the thermometer code data, the data-converting circuit has a slow operating speed and a large layout area.

Accordingly, it would be desirable to provide a data-converting circuit which has an easily expandable structure, a high operating speed, and a small layout area. It would also be desirable to provide a data-converting method using the foregoing data-converting circuit. It would further be desirable to provide a digital-to-analog converter using the foregoing data-converting circuit.

SUMMARY OF THE INVENTION

According to one aspect of the present invention, a data-converting circuit includes: a data combining circuit for outputting $1^{st}$ through $(2^n-1)^{th}$ intermediate data bits by combining binary data bits corresponding to "1"s in n-bit binary data corresponding to a decimal number; a thermometer code generating circuit for generating $1^{st}$ through $(2^n-1)^{th}$ bits of thermometer code data each activated as "1" when a corresponding intermediate data bit among the $1^{st}$ through $(2^n-1)^{th}$ intermediate data bits is activated, wherein each of the $1^{st}$ through $(2^n-1)^{th}$ bits of thermometer code data is also activated as "1" by the $1^{st}$ through $(2^n-1)^{th}$ intermediate data bits that are activated by binary data having a value greater than binary data activating the corresponding intermediate data bit among the $1^{st}$ through $(2^n-1)^{th}$ intermediate data bits; and a reset circuit for periodically resetting the $1^{st}$ through $(2^n-1)^{th}$ bits of thermometer code data to "0" in response to an external clock signal.

According to another aspect of the present invention, a data-converting circuit includes: a data combining circuit for generating $1^{st}$ through $(2^n-1)^{th}$ intermediate data bits by combining data bits corresponding to "1"s in n-bit binary data corresponding to a decimal number; a thermometer code generating circuit for generating $1^{st}$ through $(2^n-1)^{th}$ bits of thermometer code data activated as "1" when a corresponding intermediate data bit among the $1^{st}$ through $(2^n-1)^{th}$ intermediate data bits are activated, wherein each of the $1^{st}$ through $(2^n-1)^{th}$ bits of thermometer code data is also activated by the $1^{st}$ through $(2^n-1)^{th}$ intermediate data bits activated by n-bit binary data having the lowest value among n-bit binary data whose $y^{th}$ bit does not participate in activating a corresponding bit of the $1^{st}$ through $(2^n-1)^{th}$ intermediate data bits and is activated as "1" among bits which are higher-order than an $x^{th}$ bit that participates in activating the corresponding bit of the $1^{st}$ through $(2^n-1)^{th}$ intermediate data bits; and a reset circuit for periodically resetting the $1^{st}$ through $(2^n-1)^{th}$ bits of thermometer code data to "0" in response to an external clock signal, wherein in the case that the higher-order bits than the $y^{th}$ bit participate in activating the corresponding bit of the $1^{st}$ through $(2^n-1)^{th}$ intermediate data bits, the n-bit binary data whose $y^{th}$ bit does not participate in activating the corresponding bit of the $1^{st}$ through $(2^n-1)^{th}$ intermediate data bits and is activated as "1" indicate binary data having a higher-order bit of "1" that participates in the activation.

According to still another aspect of the present invention, a data-converting method includes: combining data bits corresponding to "1"s in n-bit binary data corresponding to a decimal number to generate $1^{st}$ through $(2^n-1)^{th}$ intermediate data bits; generating $1^{st}$ through $(2^n-1)^{th}$ bits of thermometer code data activated as "1" when a corresponding intermediate data bit among the $1^{st}$ through $(2^n-1)^{th}$ intermediate data bits are activated, wherein each of the $1^{st}$ through $(2^n-1)^{th}$ bits of thermometer code data are also activated by the $1^{st}$ through $(2^n-1)^{th}$ intermediate data bits that are activated by n-bit binary data having a lowest value among n-bit binary data whose $y^{th}$ bit does not participate in activating a corresponding bit of the $1^{st}$ through $(2^n-1)^{th}$ intermediate data bits and is activated as "1" among bits which are higher-order than an $x^{th}$ bit that participates in activating the corresponding bit of the $1^{st}$ through $(2^n-1)^{th}$ intermediate data bits; and periodically resetting the $1^{st}$ through $(2^n-1)^{th}$ bits of thermometer code data to "0", wherein in the case that the higher-order bits than the $y^{th}$ bit participate in activating the corresponding bit of the $1^{st}$ through $(2^n-1)^{th}$ intermediate data bits, the binary data whose $y^{th}$ bit does not participate in activating the corresponding bit of the $1^{st}$ through $(2^n-1)^{th}$ intermediate data bits and is activated as "1" indicates binary data having a higher-order bit of "1" that participates in the activation.

According to yet another aspect of the present invention, a digital-to-analog converter includes: a first data-converting circuit for converting low-order i-bit binary data among external n-bit binary data into $1^{st}$ through $(2^i-1)^{th}$ bits of column thermometer code data; a second data-converting circuit for converting j-bit binary data higher than the i-bit binary data among the external n-bit binary data into $1^{st}$ through $(2^j-1)^{th}$ bits of row thermometer code data; and a current cell array for outputting an output signal having an analog value corresponding to the n-bit binary data in response to the column thermometer code data, the row thermometer code data, k-bit binary data of the n-bit binary data excluding the i and j bits, and an external clock signal, wherein each of the first and second data-converting circuits comprises, a column or row data combining circuit for outputting the $1^{st}$ through $(2^i-1)^{th}$ bits of column data or the $1^{st}$ through $(2^j-1)^{th}$ bits of row data, respectively, by combining bits corresponding to "1" among the i- or j-bit binary data respectively, a column or row thermometer code data generating circuit for generating the column or row bit thermometer code data activated as "1" when a corresponding intermediate data bit of the column or row bit data are activated, wherein each bit of the column or row bit thermometer code data is additionally activated by the column or row bit data activated by i- or j-bit binary data having the lowest value among i- or j-bit binary data whose $y^{th}$ bit does not participate in activating corresponding bit of the column or row bit data and is activated as "1" among bits which are higher-order than an $x^{th}$ bit that participates in activating the corresponding bit of the column or row bit data, and a column or row reset circuit for periodically resetting the column or row thermometer code data to "0" in response to an external clock signal, and wherein when bits of higher-order than the $y^{th}$ bit participate in activating the corresponding bit of the column or row bit of data, the binary data whose $y^{th}$ bit does not participate in activating corresponding bit of the column or row bit data and is activated as "1" indicates binary data having a higher-order bit of "1" that participates in the activation.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

DETAILED DESCRIPTION

Now, a data-converting circuit and method, and a digital-to-analog converter using the same, will be described with reference to the accompanying drawings.

Figure 3:
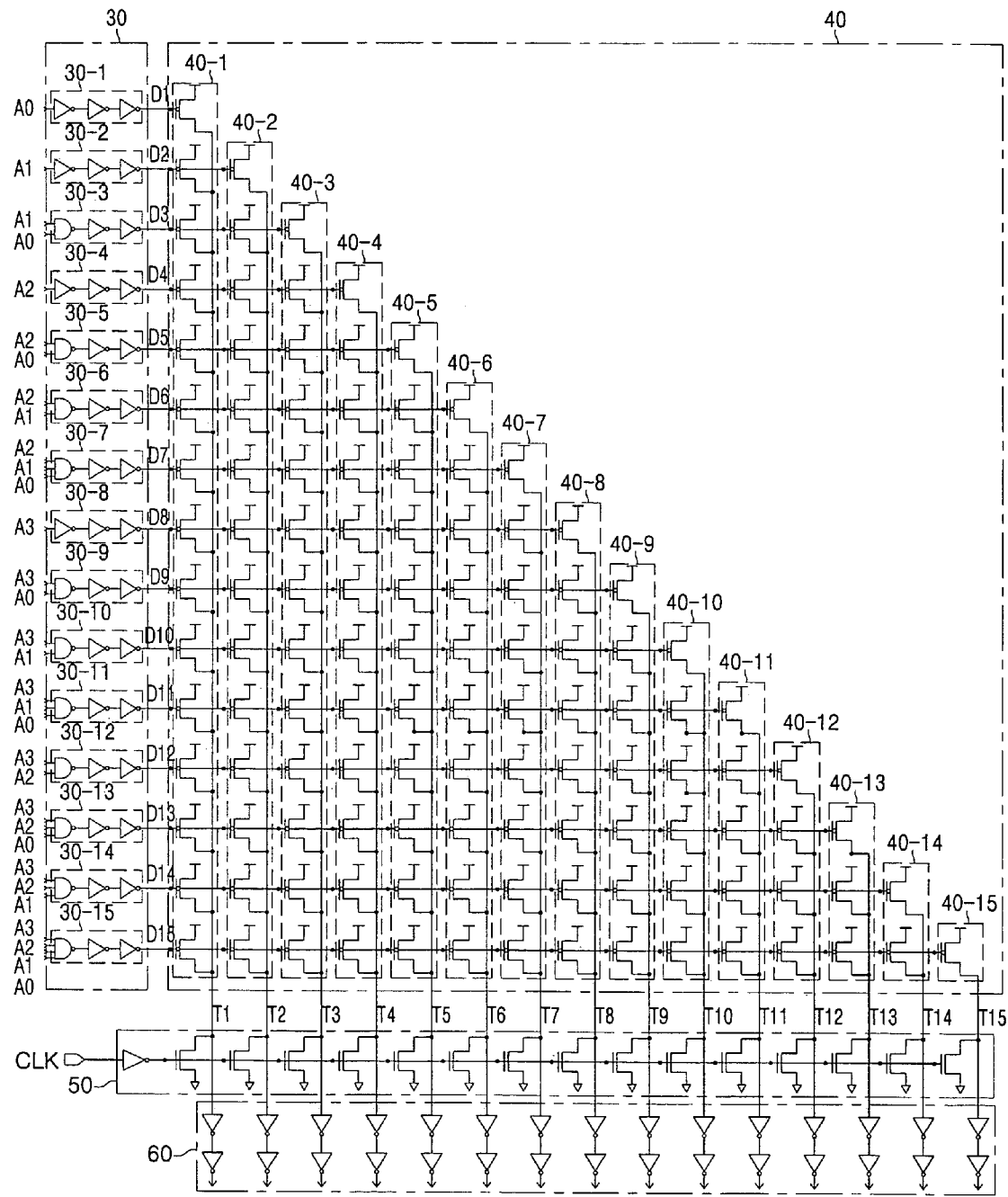
FIG. 3 is a circuit diagram of a data-converting circuit according to a first exemplary embodiment.

FIG. 3 is a circuit diagram of a data-converting circuit according to a first exemplary embodiment. The data-converting circuit includes a data combining circuit 30, a thermometer code generating circuit 40, a reset circuit 50, and an output circuit 60. The data combining circuit 30 includes $2^n-1=15$ sub-combination circuits 30-1 through 30-15 having NAND gates and inverters, where n=4. The thermometer code generating circuit 40 includes $2^n-1=15$ sub-generating circuits 40-1 through 40-15 having at least one p-channel metal oxide semiconductor (PMOS) transistor, where n=4. The reset circuit 50 includes $2^n-1=15$ n-channel metal oxide semiconductor (NMOS) transistors and an inverter, where n=4. The output circuit 60 includes inverters.

In FIG. 3, "A0" through "A3" indicate respective bits of external binary data; "T1" through "T15" indicate respective bits of thermometer code data; and "CLK" indicates an external clock signal.

That is, FIG. 3 shows an example of the data-converting circuit for converting n=4-bit binary data into $2^n-1=15$-bit thermometer code data.

The blocks shown in FIG. 3 operate as follows.

The data combining circuit 30 combines "1"s among the 4-bit binary data A0 through A3, which are converted from decimal numbers, and generates the $1^{st}$ through $15^{th}$ intermediate data bits D1 through D15. For example, the $m^{th}$ bit data value Dm among the $1^{st}$ through $15^{th}$ bit intermediate data bits D1 through D15 is generated by combining all of the binary data bits A0 through A3 having a value of "1" when the corresponding decimal number "m" is converted to binary data. That is, the sub-combination circuits 30-1 through 30-15 combine the "1"s among the binary data and output the $1^{st}$ through $15^{th}$ intermediate data bits D1 through D15.

If that the binary data has n bits, then the generated data has $1^{st}$ through $(2^n-1)^{th}$ bits. Therefore, $(2^n-1)$ sub-combination circuits are needed.

For example, the $1^{st}$ bit intermediate data bit D1 among the $1^{st}$ through $15^{th}$ intermediate data bits D1 through D15 uses only binary data bit "A0" because the binary data A0 through A3 corresponding to the decimal number "1" is "0001". That is, when "A0" is "1", the $1^{st}$ intermediate bit data is activated. And, because the binary data corresponding to the decimal number "5" is "0101", the $5^{th}$ intermediate data bit D5 is activated when "A0" and "A2" are both "1". Also, because the binary data corresponding to the decimal number "7" is "0111", the $7^{th}$ bit data D7 is activated when "A0", "A1", and "A2" are all "1". In the data combining circuit 30, when the $i^{th}$ intermediate data bit $D_i$ is activated it is a "0".

Thus, the $1^{st}$ sub-combination circuit 30-1 inverts the first binary data bit A0 of the binary data A0 through A3 using the inverter, and buffers the result using two inverters to output the $1^{st}$ intermediate data bit D1. The $5^{th}$ sub-combination circuit 30-5 performs a NAND operation on the first binary data bit A0 and the third binary data bit A2 of the binary data A0 through A3, and buffers the result using two inverters to output the $5^{th}$ intermediate data bit D5. The $7^{th}$ sub-combination circuit 30-7 performs a NAND operation on the first through third binary data bits A0, A1, and A2 of the binary data A0 through A3, and buffers the result using two inverters to output the $7^{th}$ intermediate data bit D7. The other sub-combination circuits 30-2 through 30-4, 30-6, 30-8 through 30-15 operate in the same manner.

The thermometer code generating circuit 40 generates the $1^{st}$ through $15^{th}$ bit thermometer code data T1 through T15 in response to the $1^{st}$ through $15^{th}$ intermediate data bits D1 though D15 received from the data combining circuit 30. Each bit $T_i$ of the thermometer code data is activated as "1" when a corresponding intermediate data bit $D_i$ is activated (e.g., when the intermediate data bit $D_i$ is "0"). Further, each bit $T_i$ of the thermometer code data is additionally activated as "1" when the $1^{st}$ through $15^{th}$ intermediate data bits D1 through D15 are activated by binary data having a higher value than required to activate the corresponding intermediate data bit $D_i$.

In the case of the binary data having n bits, the output thermometer code data has $(2^n-1)$ bits.

In more detail, the $1^{st}$ bit T1 of the thermometer code data is activated as "1" when the $1^{st}$ intermediate data bit D1 is activated (e.g., is "0"). And, the $5^{th}$ bit T5 of the thermometer code data is activated as "1" when the $5^{th}$ intermediate data bit D5 is activated. Also, the $7^{th}$ bit T7 of the thermometer code data is activated as "1" when the $7^{th}$ intermediate data bit D7 is activated.

In other words, when the binary data has n bits, the $m^{th}$ bit $T_m$ of the thermometer code data is activated as "1" when the $m^{th}$ bit $D_m$ of the intermediate data is activated (e.g., is a "0").

Further, each bit $T_i$ of the thermometer code data is also activated as "1" by the intermediate data bits D1 through D15 that are activated by the binary data A0 through A3 having a higher value than the binary data activating the corresponding intermediate data bit $D_i$. For example, the $1^{st}$ bit T1 of the thermometer code data is activated by the $1^{st}$ intermediate data bit D1 as described above. The binary data A0 through A3 activating the $1^{st}$ bit D1 is "0001". Thus, the $1^{st}$ bit T1 of the thermometer code data is additionally activated by the intermediate data bits D2 through D15 that are activated by the binary data "0010" through "1111" which is greater than "0001". Likewise, the $5^{th}$ bit T5 of the thermometer code data is additionally activated by the intermediate data bits D6 through D15, and the $7^{th}$ bit T7 of the thermometer code data is additionally activated by the intermediate data bits D8 through D15, etc.

The respective sub-generating circuits 40-1 through 40-15 of the thermometer code generating circuit 40 each include at least one PMOS transistor and each output a corresponding bit among the bits T1 through T15 of the thermometer code data, respectively. Each PMOS transistor is connected between an output terminal for the bit of the thermometer code data and a power supply voltage terminal, and has a gate to receive one of the $1^{st}$ through $15^{th}$ intermediate data bits D1 through D15 for activating the bits T1 through T15 of the thermometer code data. That is, the $1^{st}$ bit T1 of the thermometer code data is activated by the data D1 through D15, so the sub-generating circuit 40-1 outputting the $1^{st}$ bit T1 is connected between the output terminal and the power supply voltage terminal and includes fifteen PMOS transistors to receive the intermediate data bits D1 through D15. Likewise, the sub-generating circuit 40-5 is connected between the output terminal and the power supply voltage terminal and includes eleven PMOS transistors to receive the intermediate data bits D5 through D15. Further, the sub-generating circuit 40-7 is connected between the output terminal and the power supply voltage terminal and includes nine PMOS transistors to receive the intermediate data bits D7 through D15, etc.

The reset circuit 50 periodically resets the $1^{st}$ through $15^{th}$ bit thermometer code data T1 through T15, which is output from the thermometer code generating circuit 40, in response to the clock signal CLK, as "0". That is, because the NMOS transistors are turned on when the clock signal CLK has a low level, the thermometer code data T1 through T15 is reset as "0".

The output circuit 60 buffers and outputs the $1^{st}$ through $15^{th}$ bit thermometer code data T1 through T15 output via the thermometer code generating circuit 40 and the reset circuit 50.

Figure 1:
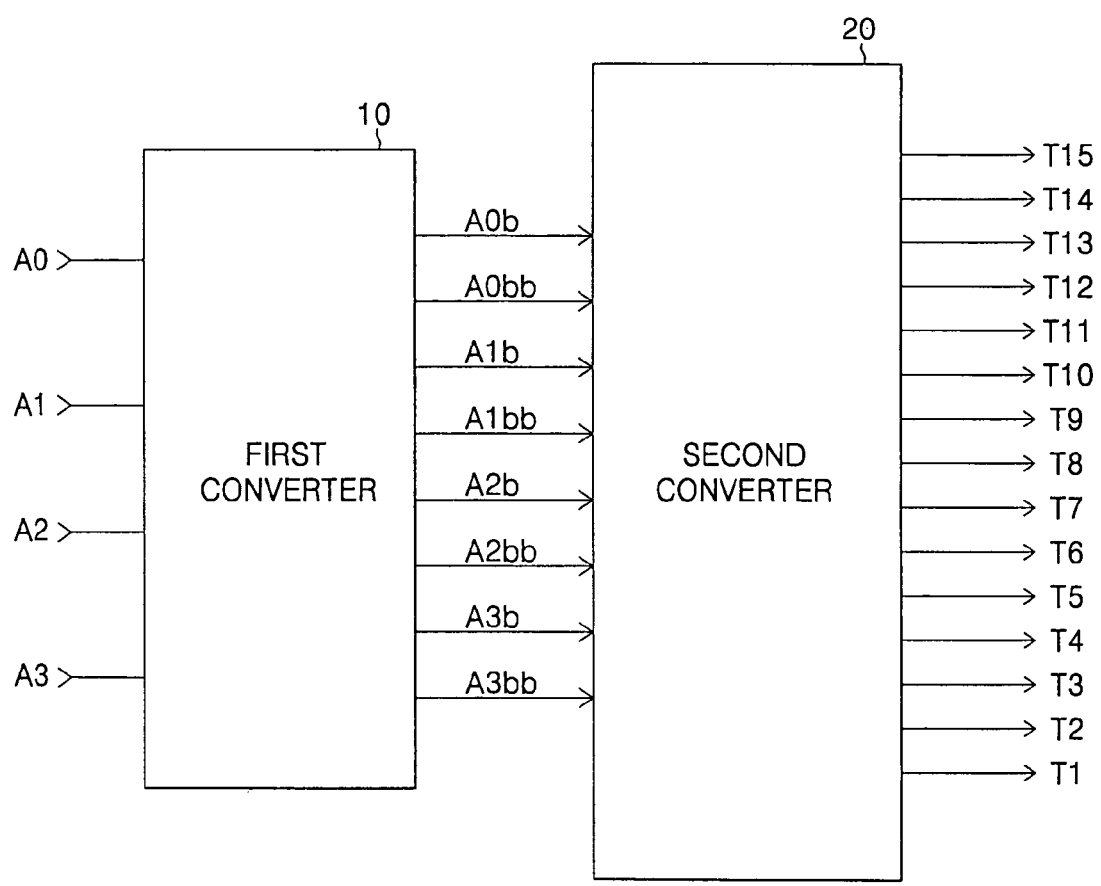
FIG. 1 is a block diagram of a conventional data-converting circuit.
Figure 2:
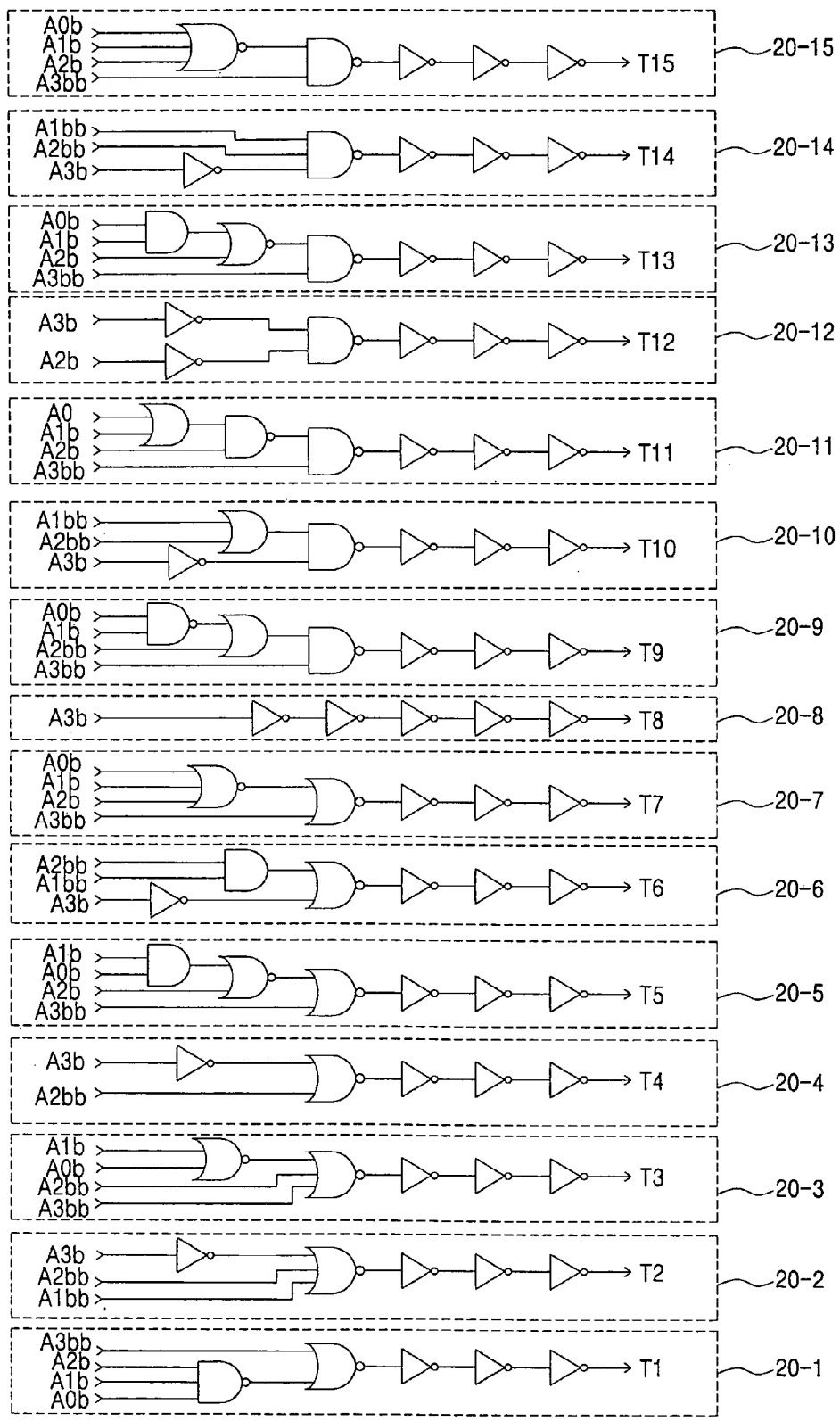
FIG. 2 is a circuit diagram showing an exemplary embodiment of a second converter of the conventional data-converting circuit of FIG. 1.

That is, in the data-converting circuit according to an exemplary embodiment shown in FIG. 3, the thermometer code data generating circuit 40 including the PMOS transistor array and the data combining circuit 30 are employed for converting the binary data A0 through A3 into the thermometer code data T1 through T15. Therefore, it is easy to expand the data-converting circuit when the binary data includes many bits. Further, fewer logic gates are needed than in the conventional data-converting circuit shown in FIGS. 1 and 2, and thus the data-converting circuit according to the above exemplary embodiment has a relatively small layout area and a relatively fast operating speed.

However, when the data-converting circuit is realized as shown in FIG. 3, there is a problem of impedance mismatch between the output terminals outputting the bits T1 through T15 of the thermometer code data. In particular, because a large number of PMOS transistors are connected to the output terminal for the $1^{st}$ bit T1, there is a loading problem.

Below, a data-converting circuit according to a second exemplary embodiment, which solves these problems, will be described.

Figure 4:
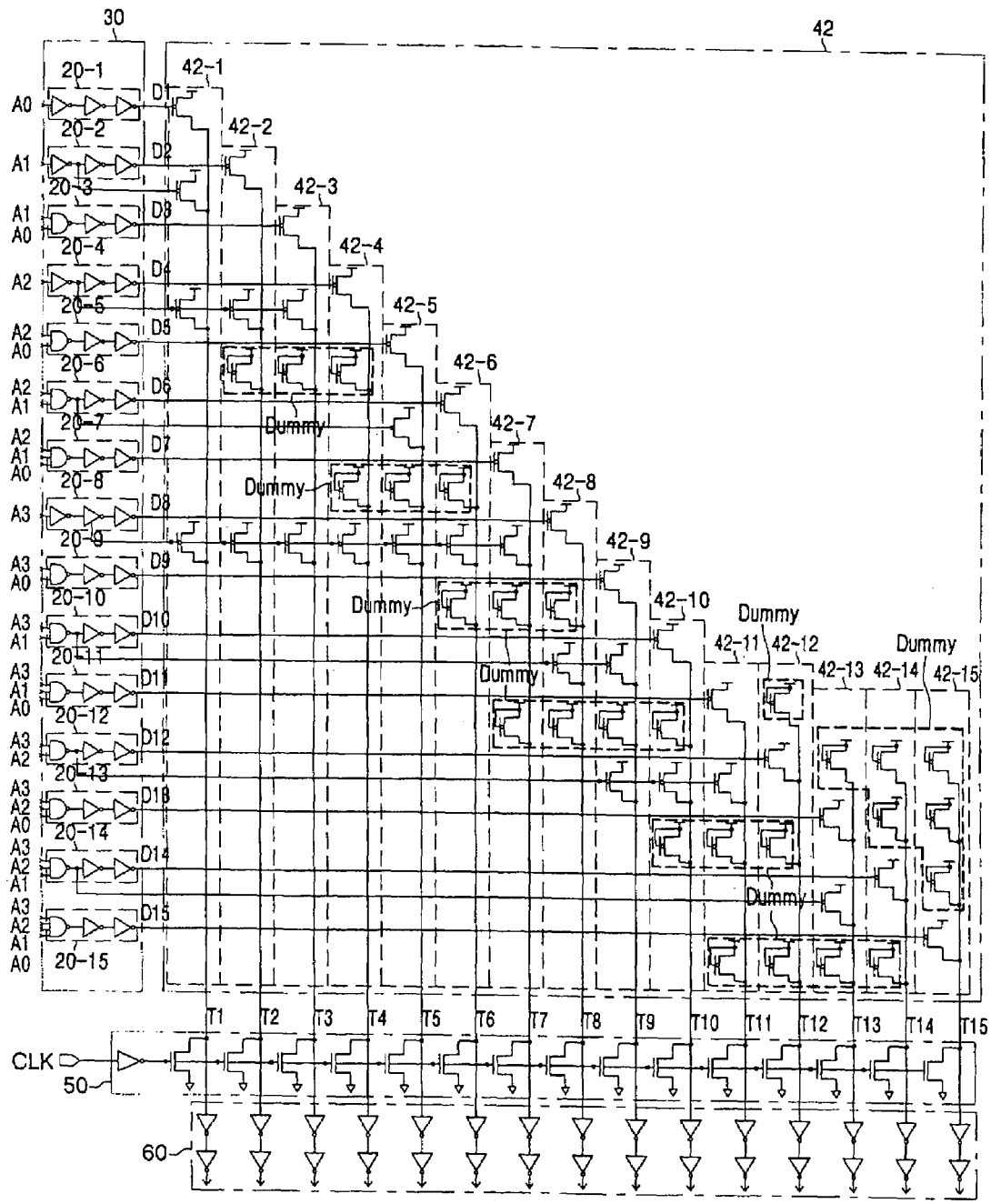
FIG. 4 is a circuit diagram of a data-converting circuit according to a second exemplary embodiment.

FIG. 4 is a circuit diagram of a data-converting circuit according to a second exemplary embodiment. The data-converting circuit according to the second exemplary embodiment includes a data combining circuit 30, a thermometer code generating circuit 42, a reset circuit 50, and an output circuit 60. Here, the data combining circuit 30 includes fifteen sub-combination circuits 30-1 through 30-15, and the thermometer code generating circuit 42 includes fifteen sub-generating circuits 42-1 through 42-15.

In FIG. 4, "Dummy" indicates a dummy transistor provided to equalize the number of PMOS transistors of the sub-generating circuits 42-1 through 42-15 at four for impedance matching at the output terminals for bits T1 through T15 of thermometer code data. The dummy transistors of FIG. 4 are connected between a power supply voltage terminal and the output terminal for some of the bits T1 through T15 of the thermometer code data, and each have a gate connected to receive the power supply voltage. FIG. 4 shows an example in which the binary data has 4 bits and thus the number of PMOS transistors is equalized at four by the dummy transistors. However, when the binary data has n bits, dummy transistors are provided to equalize the number of PMOS transistors at n.

The blocks shown in FIG. 4 operate as follows.

The data combining circuit 30 including fifteen sub-combination circuits 30-1 through 30-15, the reset circuit 50, and the output circuit 60 operate in the same manner as shown in FIG. 3 and the description thereof will not be repeated.

The thermometer code generating circuit 42 generates the $1^{st}$ through $15^{th}$ bit thermometer code data T1 through T15 in response to the $1^{st}$ through $15^{th}$ intermediate data bits D1 through D15 received from the data combining circuit 30. Each bit $T_i$ of the thermometer code data is activated as "1" when a corresponding intermediate data bit $D_i$ of the $1^{st}$ through $15^{th}$ bit data is activated (e.g., is a "0").

Further, each bit T1 through T15 of the thermometer code data is additionally activated by the $1^{st}$ through $15^{th}$ bit data activated by the binary data having the lowest value among binary data in which a $y^{th}$ bit does not participate in activating the corresponding bit D1 through D15 of the $1^{st}$ through $15^{th}$ bit data, and is activated as "1" among the higher-order bits than the $x^{th}$ bit participated in activating each bit D1 through D15 of the $1^{st}$ through $15^{th}$ bit data of the binary data A0 through A3. At this time, in the case of the higher-order bits than the $y^{th}$ bit participating in activating a bit of the $1^{st}$ through $15^{th}$ bit data, the binary data for which the $y^{th}$ bit is activated as "1" indicates binary data having a higher-order bit of "1" that participates.

As described above, if the binary data has n bits, the output thermometer code data has $(2^n-1)$ bits.

Each bit $T_i$ of the thermometer code data is activated as "1" when a corresponding intermediate data bit $D_i$ is activated. For example, the $1^{st}$ bit T1 of the thermometer code data is activated as "1" when the $1^{st}$ intermediate data bit D1 is activated. And, the $5^{th}$ bit T5 of the thermometer code data is activated as "1" when the $5^{th}$ intermediate data bit D5 is activated. Also, the $7^{th}$ bit T7 of the thermometer code data is activated as "1" when the $7^{th}$ intermediate data bit D7 is activated, etc.

In other words, if the binary data has n binary data bits, the $m^{th}$ bit $T_m$ of the $1^{st}$ through $(2^n-1)^{th}$ bits of thermometer code data is activated as "1" when the $m^{th}$ intermediate data bit $D_m$ is activated (e.g., is a "0").

Further, each bit T1 through T15 of the thermometer code data is additionally activated by predetermined intermediate data D1 through D15. The $1^{st}$ intermediate data bit D1 of the $1^{st}$ through $15^{th}$ bit data is activated by the first bit A0 of the binary data A0 through A3. That is, the first bit A0 of the binary data A0 through A3 participates in activating the $1^{st}$ intermediate data bit D1, and the second through fourth binary data bits A1, A2, and A3 do not participate in activating the $1^{st}$ intermediate data bit D1.

Binary data in which the second binary data bit A1 among the bits that do not participate in activating the $1^{st}$ intermediate data bit D1 is activated as "1" includes "0010", "0011", "0110", "0111", "1010", "1011", "1110", and "1111". Here, the binary data having the lowest value among them is "0010", and thus the $1^{st}$ bit T1 of the thermometer code data is additionally activated by the $2^{nd}$ intermediate data bit D2.

Also, binary data in which the third binary data bit A2 is activated as "1" includes "0100", "0101", "0110", "0111", "1100", "1101", "1110", and "1111". Here, the binary data having the lowest value among them is "0100", and thus the $1^{st}$ bit T1 of the thermometer code data is additionally activated by the $4^{th}$ intermediate data bit D4.

Also, binary data in which the fourth binary data bit A3 is activated as "1" includes "1000", "1001", "1010", "1011", "1100", "1101", "1110", and "1111". Here, the binary data having the lowest value among them is "1000", and thus the $1^{st}$ bit T1 of the thermometer code data is additionally activated by the $8^{th}$ intermediate data bit D8.

That is, the $1^{st}$ bit T1 of the thermometer code data is activated as "1" when the $1^{st}$ intermediate data bit D1, the $2^{nd}$ intermediate data bit D2, the $4^{th}$ intermediate data bit D4, or the $8^{th}$ intermediate data bit D8 is activated. Here, the $1^{st}$ intermediate data bit D1 is activated when the first binary data bit A0 is "1"; the $2^{nd}$ intermediate data bit D2 is activated when the second binary data bit A1 is "1"; the $4^{th}$ intermediate data bit D4 is activated when the third binary data bit A2 is "1"; and the $8^{th}$ intermediate data bit D8 is activated when the fourth binary data bit A3 is "1". Therefore, the $1^{st}$ bit T1 of the thermometer code data is activated as "1" when any one or more of the binary data bits A0 through A3 is "1".

In the meantime, the $3^{rd}$ bit T3 of the thermometer code data is activated as follows.

As described above, the $3^{rd}$ bit T3 of the thermometer code data is activated when the $3^{rd}$ intermediate data bit D3 is activated. Therefore, among the bits A0 through A3 of the binary data, the first and second bits A0 and A1 participate in activating the $3^{rd}$ intermediate data bit D3 but, the third and fourth binary data bits A2 and A3 do not participate in activating the $3^{rd}$ intermediate data bit D3.

Further, binary data in which the third binary data bit A2 is activated as "1" includes "0100", "0101", "0110", "0111", "1100", "1101", "1110", and "1111". Here, the binary data having the lowest value among them is "0100", and thus the $3^{rd}$ bit T3 of the thermometer code data is additionally activated by the $4^{th}$ bit intermediate data D4.

Also, binary data in which the fourth binary data bit A3 is activated as "1" includes "1000", "1001", "1010", "1011", "1100", "1101", "1110", and "1111". Here, the binary data having the lowest value among them is "1000", and thus the $3^{rd}$ bit T3 of the thermometer code data is additionally activated by the $8^{th}$ intermediate data bit D8.

That is, the $3^{rd}$ bit T3 of the thermometer code data is activated as "1" when the $3^{rd}$ intermediate data bit D3, the $4^{th}$ intermediate data bit D4, or the $8^{th}$ intermediate data bit D8 is activated.

In the meantime, the $5^{th}$ bit T5 of the thermometer code data is activated as follows.

As described above, the $5^{th}$ bit T5 of the thermometer code data is activated when the $5^{th}$ intermediate data bit D5 is activated. Among the bits A0 through A3 of the binary data, the first and third binary data bits A0 and A2 participate in activating the $5^{th}$ intermediate data bit D5 of the $1^{st}$ through $15^{th}$ bit data, but the second and fourth binary data bits A1 and A3 do not participate in activating the $5^{th}$ bit intermediate data D5.

Binary data in which the second binary data bit A1 is activated as "1" includes "0010", "0011", "0110", "0111", "1010", "1011", "1110", and "1111". In this case, the third binary data bit A2, which is higher-order than the second binary data bit A1 that does not participate in activating the $5^{th}$ intermediate data bit D5, also participates in activating the $5^{th}$ intermediate data bit. Hence, binary data whose second bit A1 and third bit A2 are both "1" includes "01110", "0111", "1110", and "1111". Here, the binary data having the lowest value among them is "0110", and thus the $5^{th}$ bit T5 of the thermometer code data is additionally activated by the $6^{th}$ intermediate data bit D6.

Further, binary data in which the fourth binary data bit A3 is activated as "1" includes "1000", "1010", "1011", "1100", "1101", "1110", and "1111". Among the bits that are higher order than the fourth bit A3, there is no bit that participates in activating the $5^{th}$ intermediate data bit D5. Here, the binary data having the lowest value among the binary data is "1000", and thus the $5^{th}$ bit T5 of the thermometer code data is additionally activated by the $8^{th}$ intermediate data bit D8.

As a result, the $5^{th}$ bit T5 of the thermometer code data is activated as "1" by the $5^{th}$ intermediate data bit D5, the $6^{th}$ intermediate data bit D6, or the $8^{th}$ intermediate data bit D8.

Meanwhile, the $7^{th}$ bit T7 of the thermometer code data is activated by the $7^{th}$ bit intermediate data D7.

Among the binary data A0 through A3, the fourth bit A3 does not participate in activating the $7^{th}$ intermediate data bit D7. Here, among the binary data whose fourth bit A3 is activated as "1", the binary data having the lowest value is "1000", and thus the 7$^{th}$ bit T7 of the thermometer code data is additionally activated as "1" when the 8$^{th}$ intermediate data bit D8 is activated.

Thus, the 7$^{th}$ bit T7 of the thermometer code data is activated as "1" when the 7$^{th}$ intermediate data bit D7 or the 8$^{th}$ intermediate data bit D8 is activated.

Meanwhile, the 10$^{th}$ bit T10 of the thermometer code data is activated as follows.

As described above, the 10$^{th}$ bit T10 of the thermometer code data is activated when the 10$^{th}$ intermediate data bit D10 is activated. Among the bits A0 through A3 of the binary data, the second and fourth binary data bits A1 and A3 participate in activating the 10$^{th}$ intermediate data bit D10 of the 1$^{st}$ through 15$^{th}$ bit data, but the first and third binary data bits A0 and A2 do not participate in activating the 10$^{th}$ bit intermediate data D10.

Binary data in which the first binary data bit A0 is not higher order than the second and fourth binary data bits A1 and A3 participate in activating the 10$^{th}$ intermediate data bit D10.

Binary data in which the third binary data bit A2 is activated as "1" includes "0100", "0101", "0110", "0111", "1100" "1101", "1110", and "1111". In this case, the fourth binary data bit A3, which is higher-order than the third binary data bit A2 that does not participate in activating the 10$^{th}$ intermediate data bit D10, also participates in activating the 10$^{th}$ intermediate data bit. Hence, binary data whose third bit A2 and fourth bit A3 are both "1" includes "1100", "1101", "1110", and "1111". Here, the binary data having the lowest value among them is "1100", and thus the 10$^{th}$ bit T10 of the thermometer code data is additionally activated by the 12$^{th}$ intermediate data bit D12.

As a result, the 10$^{th}$ bit T10 of the thermometer code data is activated as "1" by the 10$^{th}$ intermediate data bit D10, or the 12$^{th}$ intermediate data bit D12.

In the data-converting circuit, the function and the configuration of the sub-generating circuits 42-1 through 42-15 of the thermometer code generating circuit 42 are as follows.

The sub-generating circuits 42-1 through 42-15 generate the bits T1 through T15 of the thermometer code data in response to the intermediate data bits D1 through D15, respectively.

Each of the sub-generating circuits 42-1 through 42-15 includes at least one PMOS transistor connected between the output terminal for a corresponding one of the bits T1 through T15 of the thermometer code data and the power supply voltage terminal and having a gate to receive the corresponding intermediate data bit D1 through D15 for activating the bits T1 through T15 of the thermometer code data as "1".

For example, the 1st sub-generating circuit 42-1 outputting the 1$^{st}$ bit T1 of the thermometer code data operates as follows.

As described above, the 1$^{st}$ bit T1 of the thermometer code data is activated as "1" when the 1$^{st}$ intermediate data bit D1, the 2$^{nd}$ bit intermediate data D2, the 4$^{th}$ bit intermediate data D4 or the 8$^{th}$ bit intermediate data D8 is activated. Thus, the 1$^{st}$ sub-generating circuit 42-1 includes four PMOS transistors connected between the power supply voltage terminal and the output terminal for the 1$^{st}$ bit T1 of the thermometer code data, each PMOS transistor having a gate to receive one of the 1$^{st}$ bit intermediate data D1, the 2$^{nd}$ intermediate data bit D2, the 4$^{th}$ intermediate data bit D4, or the 8$^{th}$ intermediate data bit D8.

The 5th sub-generating circuit 42-5 operates as follows.

As described above, the 5$^{th}$ bit T5 of the thermometer code data is activated as "1" when the 5$^{th}$ intermediate data bit D5, the 6$^{th}$ intermediate data bit D6, or the 8$^{th}$ intermediate data bit D8 is activated. Thus, the 5th sub-generating circuit 42-5 includes three PMOS transistors connected between the power supply voltage terminal and the output terminal for the 5$^{th}$ bit T5 of the thermometer code data, each PMOS transistor having a gate to receive one of the 5$^{th}$ intermediate data bit D5, the 6$^{th}$ intermediate data bit D6, or the 8$^{th}$ intermediate data bit D8. Here, the number of PMOS transistors is less than four, so that one dummy transistor is added for impedance matching to bring the total number of PMOS transistors to four.

The 7th sub-generating circuit 42-7 operates as follows.

As described above, the 7$^{th}$ bit T7 of the thermometer code data is activated as "1" when the 7$^{th}$ intermediate data bit D7 or the 8$^{th}$ intermediate data bit D8 is activated. Thus, the 7th sub-generating circuit 42-7 includes two PMOS transistors connected between the power supply voltage terminal and the output terminal for the 7$^{th}$ bit T7 of the thermometer code data, each PMOS transistor having a gate to receive the 7$^{th}$ intermediate data bit D7 or the 8$^{th}$ intermediate data bit D8. Here, the number of PMOS transistors is two, so that two dummy transistors are added for impedance matching to bring the total number of PMOS transistors to four.

The 10th sub-generating circuit 42-10 operates as follows.

As described above, the 10$^{th}$ bit T10 of the thermometer code data is activated as "1" when the 10$^{th}$ intermediate data bit D10 or the 12$^{th}$ intermediate data bit D12 is activated. Thus, the 10th sub-generating circuit 42-10 includes two PMOS transistors connected between the power supply voltage terminal and the output terminal for the 10$^{th}$ bit T10 of the thermometer code data, each PMOS transistor having a gate to receive the 10$^{th}$ intermediate data bit D10 or the 12$^{th}$ intermediate data bit D12. Here, the number of PMOS transistors is two, so that two dummy transistors are added for impedance matching to bring the total number of PMOS transistors to four.

In the foregoing exemplary embodiments, the 1$^{st}$ bit T1, the 5$^{th}$ bit T5, the 7$^{th}$ bit T7, and the 10$^{th}$ bit T10 of the thermometer code data are described as examples. Any of the other bits T2 through T4, T6, T8 through T9, and T11 through T15 can be described in the same manner.

Further, in the foregoing exemplary embodiments, binary data having 4 bits is described as an example, but the principles are not limited to 4-bit binary data. The data-converting circuit can be easily expanded and applied to binary data having n bits.

Figure 5:
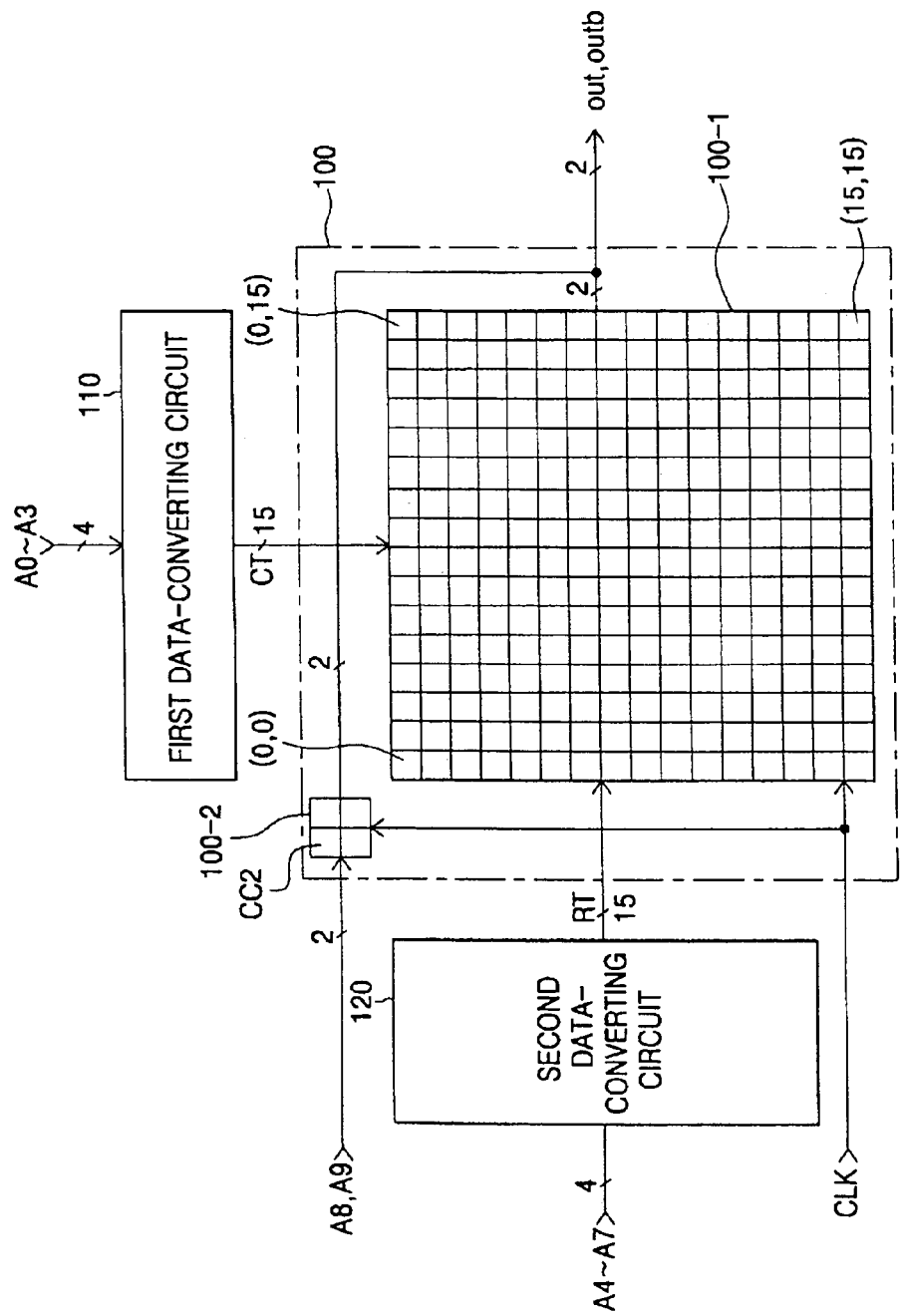
FIG. 5 is a block diagram of a digital-to-analog converter.

FIG. 5 is a block diagram of a digital-to-analog converter according to an exemplary embodiment. The digital-to-analog converter includes first and second data-converting circuits 110 and 120, and a current cell array 100. Here, the current cell array 100 includes a first current cell array 100-1 and a second current cell array 100-2. In FIG. 5, "CC1" indicates a first current cell, "CC2" indicates a second current cell, "CT" indicates the 1$^{st}$ through 15$^{th}$ bit column thermometer code data, and "RT" indicates the 1$^{st}$ through 15$^{th}$ bit row thermometer code data.

That is, the digital-to-analog converter of FIG. 5 employs the data-converting circuits 110 and 120 for converting two 4-bit binary data into 15-bit thermometer code data, thereby realizing a 10-bit digital-to-analog converter.

The blocks shown in FIG. 5 operate as follows.

The current cell array 100 outputs an output signal out having an analog value in response to the thermometer code data received from the first and second data-converting circuits 110 and 120 and data A8 and A9 received from the outside. The output signal out can be output as a current or voltage.

The first current cell array 100-1 includes 256 first current cells CC1 represented with coordinate (0,0) to (15, 15) and outputs the analog value in response to the column and row thermometer code data CT and RT received from the first and second data-converting circuits 110 and 120.

The second current cell array 100-2 includes four second current cells CC2 and outputs the analog value in response to the data A8 and A9 received from the outside. Each second current cell CC2 has a 256-times higher driving capability than the first current cell CC1.

The first and second data-converting circuits 110 and 120 convert the input data A0 through A3, and A4 through A7 into the column and row thermometer code data CT and RT. The column thermometer code data CT output from the first data-converting circuit 110 is used as a column signal for the first current cell array 100-1, and the row thermometer code data RT output from the second data-converting circuit 120 is used as a row signal for the first current cell array 100-1.

That is, the digital-to-analog converter shown in FIG. 5 varies the number of current cells CC1 and CC2 driven according to the number of bits activated as "1" among the column and row thermometer code data CT and RT output from the first and second data-converting circuits 110 and 120, and the most significant bits A8 and A9 of the binary data received from the outside, thereby varying the analog value of the output signal out according to the binary data A0 through A9 received from the outside.

Here, the first and second data-converting circuits 110 and 120 can have the same configuration as the data-converting circuit according to the first and second exemplary embodiments of FIGS. 3 and 4.

Figure 6:
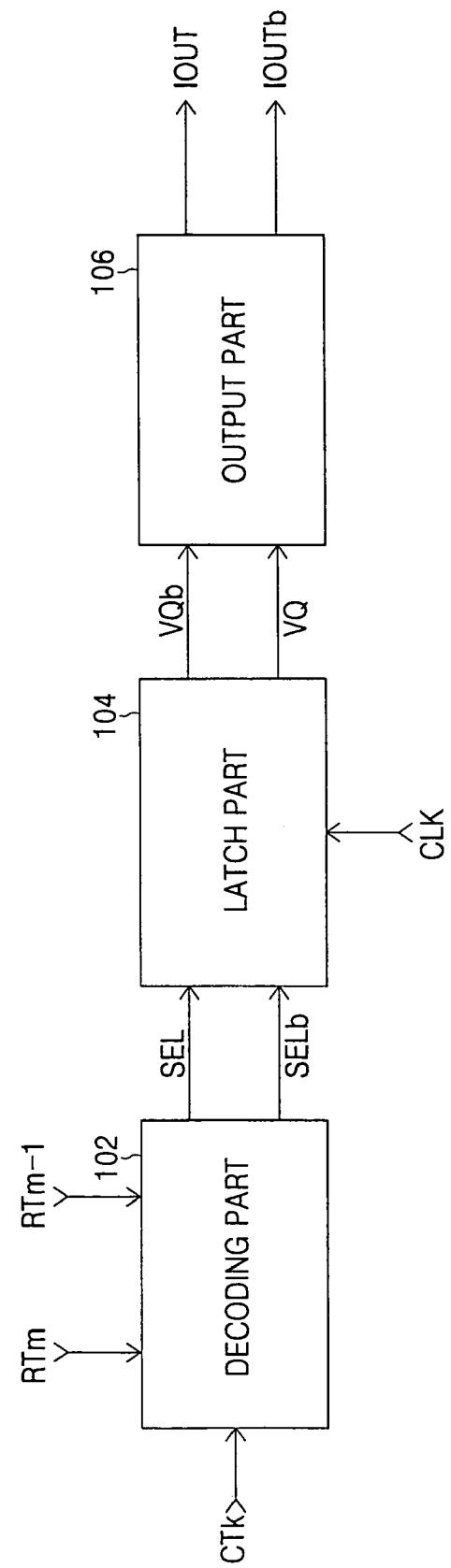
FIG. 6 is a block diagram showing a current cell of the digital-to-analog converter of FIG. 5.

FIG. 6 is a block diagram showing a current cell of the current cell array 100 provided in the digital-to-analog converter of FIG. 5. The current cell includes a decoding part 102, a latch part 104, and an output part 106. In FIG. 6, "CTk" indicates a bit of the column thermometer code data CT for a corresponding current cell, "RTm" indicates a bit of the row thermometer code data RT for the corresponding current cell, and "RTm−1" indicates a bit of the row thermometer code data RT for a previous current cell adjacent to the corresponding current cell.

The blocks shown in FIG. 6 operate as follows.

The decoding part 102 outputs a selection signal SEL and an inverted selection signal SELb in response to the bit CTk of the column thermometer code data for the corresponding current cell, the bit RTm of the row thermometer code data for the corresponding current cell, and the bit RTm−1 of the row thermometer code data for the previous current cell adjacent to the corresponding current cell.

The latch part 104 latches the selection signal SEL and the inverted selection signal SELb in response to the external clock signal CLK received from the outside, thereby outputting an inverted control signal VQb and a control signal VQ.

The output part 106 outputs an output signal IOUT and an inverted output signal IOUTb in response to the inverted control signal VQb and the control signal VQ.

Figure 7:
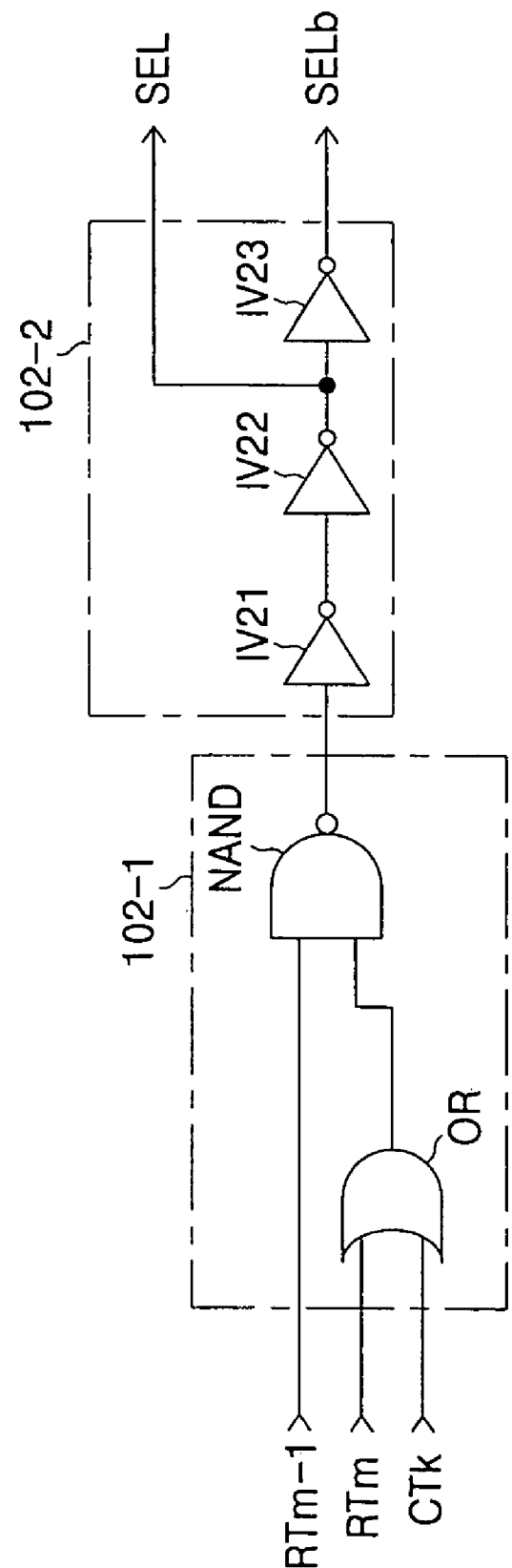
FIG. 7 is a block diagram illustrating an exemplary embodiment of a decoding part of the current cell of FIG. 6.

FIG. 7 is a block diagram illustrating an exemplary embodiment of the decoding part 102 of the current cell of FIG. 6. The decoding part 102 includes a logic circuit 102-1 and an output circuit 102-2. Here, the logic circuit 102-1 has an OR gate OR and a NAND gate NAND, and the output circuit 102-2 has three inverters IV21, IV22, and IV23.

The blocks shown in FIG. 7 operate as follows.

The logic circuit 102-1 activates the selection signal SEL as "0" when the bit RTm−1 of the row thermometer code data RT for the previous current cell adjacent to the corresponding current cell is activated as "1", and either or both of the bit RTm of the row thermometer code data RT for the corresponding current cell or the bit CTk of the column thermometer code data CT for the corresponding current cell is activated as "1".

However, the logic circuit 102-1 of the current cells corresponding to row 0 represented with coordinates (0,1) to (0,15) activate the selection signal SEL as "0" when the bit CTk of the column thermometer code data CT for the corresponding current cell is activated as "1". And the logic circuit 102-1 of the current cells corresponding to column 0 represented with coordinates (1,0) to (15, 0) activate the selection signal SEL as "0" when the bit RTm of the row thermometer code data RT for the corresponding current cell is activated as "1". Also, the current cell represented with coordinate (0,0) is supplied with the power and is always activated.

The output circuit 102-2 employs the two inverters IV21 and IV22 for buffering and outputting the selection signal SEL output from the logic circuit 102-1, and the inverter IV23 for inverting the selection signal SEL into an inverted selection signal SELb.

For example, if the row thermometer code data RT is "0000000011111111" and the column thermometer code data CT is "0000000011111111", the current cells corresponding to the row 1 to 8 has the selection signal SEL activated as "0" because the bits RT1 through RT7 of the row thermometer code data RT for the previous current cell adjacent to the corresponding current cell are "1" and the bits RT1 through RT8 of the row thermometer code data RT for the corresponding current cell are "1". And, the current cells corresponding to the columns 1 to 8 among the current cells corresponding to the row 9 has the selection signal SEL activated as "0" because the bit RT8 of the row thermometer code data RT for the previous current cell adjacent to the corresponding current cell are "1" and the bits CT1 through CT8 of the column thermometer code data CT for the corresponding current cell are "1". Here, the rest of the current cells have the selection signals SEL which are not activated.

Figure 8:
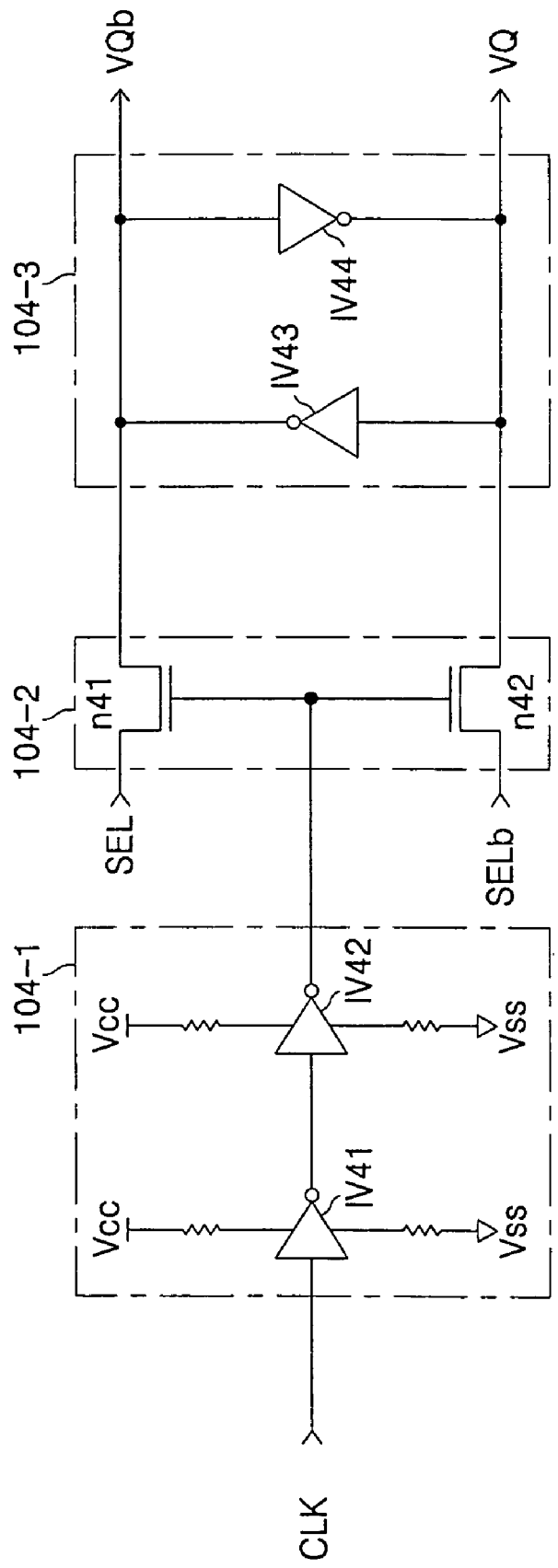
FIG. 8 is a block diagram illustrating an exemplary embodiment of a latch part of the current cell of FIG. 6.

FIG. 8 is a block diagram illustrating an exemplary embodiment of the latch part 104 of the current cell of FIG. 6. Here, the latch part 104 includes a delay circuit 104-1, a switch circuit 104-2, and a latch circuit 104-3.

The blocks shown in FIG. 8 operate as follows.

The delay circuit 104-1 delays and outputs the clock signal CLK received from the outside for a predetermined period of time. Here, the delay circuit 104-1 is used to control the timing of the digital-to-analog converter and can be omitted.

The switch circuit 104-2 transmits the selection signal SEL and the inverted selection signal SELb received from the logic circuit 102 in response to the delayed clock signal received from the delay circuit 104-1.

The latch circuit 104-3 latches the selection signal SEL and the inverted selection signal SELb received from the switch circuit 104-2, thereby outputting the inverted control signal VQb and the control signal VQ.

That is, the latch part 104 shown in FIG. 8 transmits the selection signal SEL and the inverted selection signal SELb to the latch circuit 104-3 when the clock signal CLK has a high level, and the latch circuit 104-3 outputs the latched selection signal SEL and the latched inverted selection signal SELb as the inverted control signal VQb and the control signal VQ when the clock signal CLK has a low level.

Figure 9:
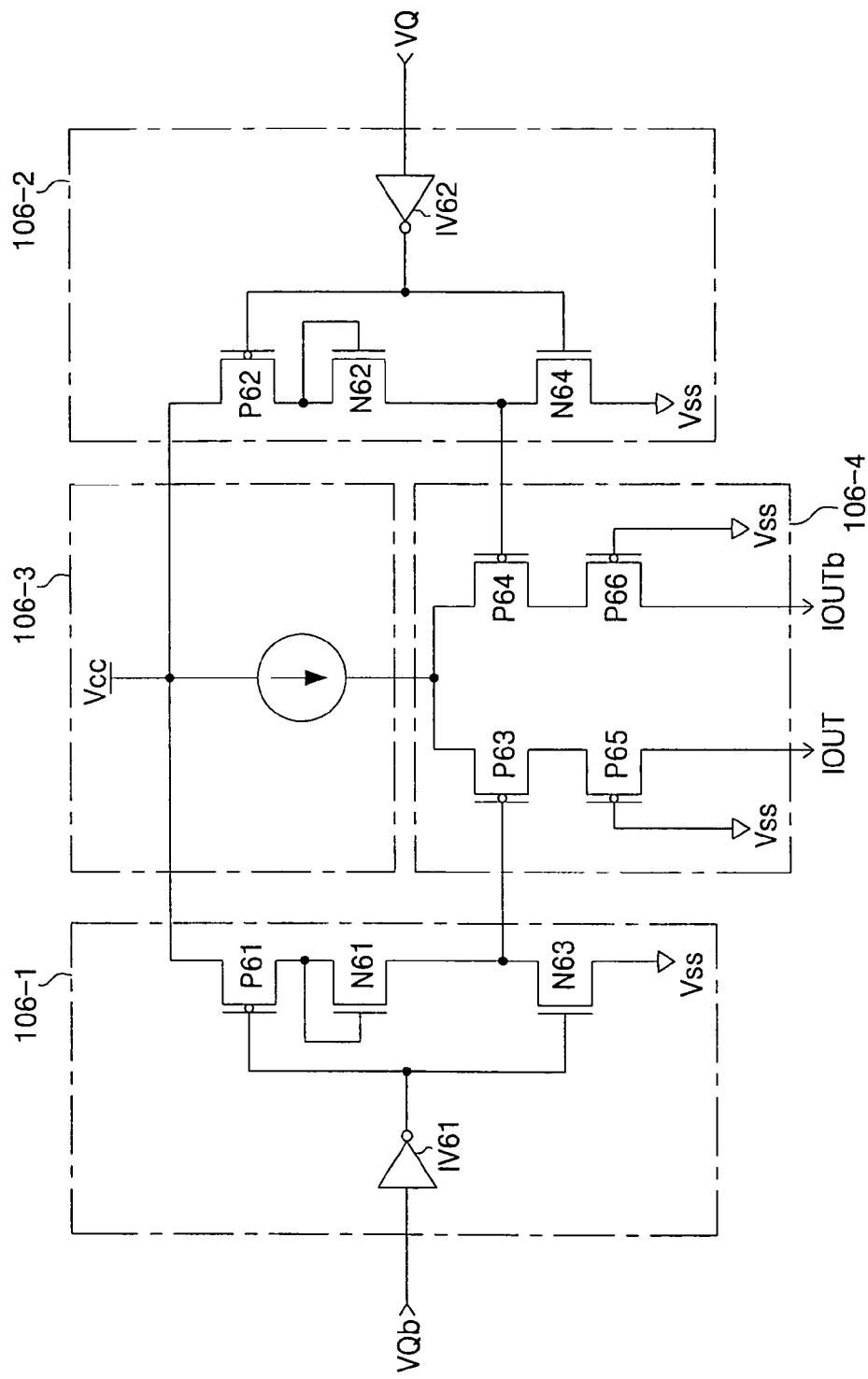
FIG. 9 is a block diagram illustrating an exemplary embodiment of an output part of the current cell of FIG. 6.

FIG. 9 is a block diagram illustrating an exemplary embodiment of the output part 106 of the current cell of FIG. 6. Here, the output part 106 includes a first control circuit 106-1, a second control circuit 106-2, a bias current output circuit 106-3, and an output circuit 106-4.

The blocks shown in FIG. 9 operate as follows.

The first and second control circuits 106-1 and 106-2 output signals for turning PMOS transistors P63 and P64 of the output circuit 106-4 on/off in response to the inverted control signal VQb and the control signal VQ, respectively. The first and second control circuits 106-1 and 106-2 each operate like two inverters connected in series, but the power supply voltage Vcc for the current cell generally has a lower level than that applied to the logic gates, so that the swing widths of the signals output from the first and second control circuits 106-1 and 106-2 become narrower than the swing widths of the inverted control signal VQb and the control signal VQ. That is, the first and second control circuits 106-1 and 106-2 decrease the swing width of the signals applied to the PMOS transistors P63 and P64, thereby reducing influences of noise, and enhancing operation speed. Here, the first and second control circuits 106-1 and 106-2 can be omitted.

The bias current output circuit 106-3 outputs a constant bias current.

The output circuit 106-4 outputs an output signal IOUT and an inverted output signal IOUTb in response to the signals received from the first and second control circuits 106-1 and 106-2. When the inverted control signal VQb has a low level and the control signal VQ has a high level, the first control circuit 106-1 outputs a low level signal and the second control circuit 106-2 outputs a high level signal so that the PMOS transistor P63 is turned on and the PMOS transistor P64 is turned off, thereby allowing the output circuit 106-4 to output the bias current to a terminal for the output signal IOUT. On the other hand, when the inverted control signal VQb has a high level and the control signal VQ has a low level, the first control circuit 106-1 outputs a high level signal and the second control circuit 106-2 outputs a low level signal so that the PMOS transistor P63 is turned off and the PMOS transistor P64 is turned on, thereby allowing the output circuit 106-4 to output the bias current to a terminal for the inverted output signal IOUTb.

In the foregoing exemplary embodiments, the operation of the current cell is described with respect to the first current cell CC1 of the first current cell array 100-1. Furthermore, the second current cell CC2 of the second current cell array 100-2 also has the same configuration as shown in FIGS. 6 through 9. In this case, the $g^{th}$ bit of the binary data A0 through A9 is used instead of each bit of the column thermometer code data CT, and the $10^{th}$ bit of the binary data A0 through A9 is used instead of each bit of the row thermometer code data RT. Further, the output part 106 of the first current cell CC1 shown in FIG. 9 has a higher driving capability than the output part of the second current cell CC2. Except for these differences, the second current cell CC2 has the same configuration as the first current cell CC1 shown in FIGS. 6 and 9.

A 10-bit digital-to-analog converter is described above and illustrated in FIG. 5 as an example, but the principles are not limited to such a 10-bit converter. The digital-to-analog converter can be expanded using a data converting circuit as disclosed above. Further, the digital-to-analog converter shown in FIG. 5 employs two data-converting circuits 110 and 120, but alternatively may employ only one data-converting circuit.

Thus, the data-converting circuit according to the exemplary embodiments as disclosed above employs the data combining circuit having a simple configuration and the thermometer code generating circuit having the PMOS transistor array, so that it is easy to realize and expand the circuit for converting the binary data into the thermometer code data. Further, the number of logic gates is decreased, thereby enhancing the operating speed.

As described above, the present invention provides a data-converting circuit, a data-converting method, and a digital-to-analog converter, which are easily realized and expanded and have increased operating speed.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the scope of the present invention as set forth in the following claims.

What is claimed is:

1. A data-converting circuit comprising:
    a data combining circuit for outputting $1^{st}$ through $(2^n-1)^{th}$ intermediate data bits by combining binary data bits corresponding to "1"s in n-bit binary data corresponding to a decimal number;
    a thermometer code generating circuit for generating $1^{st}$ through $(2^n-1)^{th}$ bits of thermometer code data each activated as "1" when a corresponding intermediate data bit among the $1^{st}$ through $(2^n-1)^{th}$ intermediate data bits is activated, wherein each of the $1^{st}$ through $(2^n-1)^{th}$ bits of thermometer code data is also activated as "1" by the $1^{st}$ through $(2^n-1)^{th}$ intermediate data bits that are activated by binary data having a value greater than binary data activating the corresponding intermediate data bit among the $1^{st}$ through $(2^n-1)^{th}$ intermediate data bits; and
    a reset circuit for periodically resetting the $1^{st}$ through $(2^n-1)^{th}$ bits of thermometer code data to "0" in response to an external clock signal.

2. The data-converting circuit according to claim 1, wherein the data combining circuit comprises $(2^n-1)$ sub-combination circuits for each outputting a corresponding one of the $1^{st}$ through $(2^n-1)^{th}$ intermediate data bits.

3. The data-converting circuit according to claim 2, wherein each of the $(2^n-1)$ sub-combination circuits further comprises a buffer for buffering and outputting the corresponding one of the $1^{st}$ through $(2^n-1)^{th}$ intermediate data bits.

4. The data-converting circuit according to claim 1, wherein the thermometer code generating circuit comprises $(2^n-1)$ sub-generating circuits for outputting a corresponding bit among the $1^{st}$ through $(2^n-1)^{th}$ bits of thermometer code data, and
    each of the $(2^n-1)$ sub-generating circuits comprises at least one PMOS transistor connected between an output terminal for the corresponding bit of the thermometer code data and a power supply voltage terminal and having a gate for receiving one of the intermediate data bits to activate the corresponding bit of the thermometer code data as "1".

5. The data-converting circuit according to claim 1, further comprising an output part to buffer and output each of the $1^{st}$ through $(2^n-1)^{th}$ bits of thermometer code data.

6. A data-converting circuit comprising:

a data combining circuit for generating $1^{st}$ through $(2^n-1)^{th}$ intermediate data bits by combining data bits corresponding to "1"s in n-bit binary data corresponding to a decimal number;

a thermometer code generating circuit for generating $1^{st}$ through $(2^n-1)^{th}$ bits of thermometer code data activated as "1" when a corresponding intermediate data bit among the $1^{st}$ through $(2^n-1)^{th}$ intermediate data bits are activated, wherein each of the $1^{st}$ through $(2^n-1)^{th}$ bits of thermometer code data is also activated by the $1^{st}$ through $(2^n-1)^{th}$ intermediate data bits activated by n-bit binary data having the lowest value among n-bit binary data whose $y^{th}$ bit does not participate in activating a corresponding bit of the $1^{st}$ through $(2^n-1)^{th}$ intermediate data bits and is activated as "1" among bits which are higher-order than an $x^{th}$ bit that participates in activating the corresponding bit of the $1^{st}$ through $(2^n-1)^{th}$ intermediate data bits; and a reset circuit for periodically resetting the $1^{st}$ through $(2^n-1)^{th}$ bits of thermometer code data to "0" in response to an external clock signal, wherein in the case that the higher-order bits than the $y^{th}$ bit participate in activating the corresponding bit of the $1^{st}$ through $(2^n-1)^{th}$ bits of data, the n-bit binary data whose $y^{th}$ bit does not participate in activating the corresponding bit of the $1^{st}$ through $(2^n-1)^{th}$ bits of data and is activated as "1" indicate binary data having a higher-order bit of "1" that participates in the activation.

7. The data-converting circuit according to claim 6, wherein the data combining circuit comprises $(2^n-1)$ sub-combination circuits for each outputting a corresponding one of the $1^{st}$ through $(2^n-1)^{th}$ intermediate data bits.

8. The data-converting circuit according to claim 7, wherein each of the $(2^n-1)$ sub-combination circuits further comprises a buffer for buffering and outputting the corresponding bit among the $1^{st}$ through $(2^n-1)^{th}$ intermediate data bits.

9. The data-converting circuit according to claim 6, wherein the thermometer code generating circuit comprises $(2^n-1)$ sub-generating circuits for outputting a corresponding bit among the $1^{st}$ through $(2^n-1)^{th}$ bits of thermometer code data and each of the $(2^n-1)$ sub-generating circuits comprises at least one PMOS transistor connected between an output terminal for the corresponding bit of the thermometer code data and a power supply voltage terminal, and having a gate for receiving one of the $1^{st}$ through $(2^n-1)^{th}$ intermediate data bits to activate the corresponding bit of the thermometer code data as "1".

10. The data-converting circuit according to claim 9, wherein each of the $(2^n-1)$ sub-generating circuits comprises at least one dummy PMOS transistor to make the total number of PMOS transistors thereof equal to n when the number of PMOS transistors provided in each sub-generating circuit is less than n, and each dummy PMOS transistor is connected between a power supply voltage terminal and an output terminal for the corresponding bit of the thermometer code data and comprises a gate to receive a power supply voltage.

11. The data-converting circuit according to claim 6, further comprising an output part to buffer and output each of the $1^{st}$ through $(2^n-1)^{th}$ bits of thermometer code data.

12. A data-converting method comprising:

combining data bits corresponding to "1"s in n-bit binary data corresponding to a decimal number to generate $1^{st}$ through $(2^n-1)^{th}$ intermediate data bits;

generating $1^{st}$ through $(2^n-1)^{th}$ bits of thermometer code data activated as "1" when a corresponding intermediate data bit among the $1^{st}$ through $(2^n-1)^{th}$ intermediate data bits are activated, wherein each of the $1^{st}$ through $(2^n-1)^{th}$ bits of thermometer code data are also activated by the $1^{st}$ through $(2^n-1)^{th}$ intermediate data bits that are activated by n-bit binary data having a lowest value among n-bit binary data whose $y^{th}$ bit does not participate in activating a corresponding bit of the $1^{st}$ through $(2^n-1)^{th}$ intermediate data bits and is activated as "1" among bits which are higher-order than an $x^{th}$ bit that participates in activating the corresponding bit of the $1^{st}$ through $(2^n-1)^{th}$ intermediate data bits; and periodically resetting the $1^{st}$ through $(2^n-1)^{th}$ bits of thermometer code data to "0", wherein in the case that the higher-order bits than the $y^{th}$ bit participate in activating the corresponding bit of the $1^{st}$ through $(2^n-1)^{th}$ intermediate data bits, the binary data whose $y^{th}$ bit does not participate in activating the corresponding bit of the $1^{st}$ through $(2^n-1)^{th}$ intermediate data bits and is activated as "1" indicates binary data having a higher-order bit of "1" that participates in the activation.

13. The data-converting method according to claim 12, wherein combining data bits comprises:

combining the $1^{st}$ through $(2^n-1)^{th}$ intermediate data bits by performing a NAND operation on bits of data of the n-bit binary data corresponding to "1"; and buffering and outputting the $1^{st}$ through $(2^n-1)^{th}$ intermediate data bits.

14. The data-converting method according to claim 12, further comprising buffering and outputting each bit of the $1^{st}$ through $(2^n-1)^{th}$ bits of thermometer code data.

15. A digital-to-analog converter comprising:

a first data-converting circuit for converting low-order i-bit binary data among external n-bit binary data into $1^{st}$ through $(2^i-1)^{th}$ bits of column thermometer code data;

a second data-converting circuit for converting j-bit binary data higher than the i-bit binary data among the external n-bit binary data into $1^{st}$ through $(2^j-1)^{th}$ bits of row thermometer code data; and a current cell array for outputting an output signal having an analog value corresponding to the n-bit binary data in response to the column thermometer code data, the row thermometer code data, k-bit binary data of the n-bit binary data excluding the i and j bits, and an external clock signal, wherein each of the first and second data-converting circuits comprises, a column or row data combining circuit for outputting the $1^{st}$ through $(2^i-1)^{th}$ bits of column data or the $1^{st}$ through $(2^j-1)^{th}$ bits of row data, respectively, by combining bits corresponding to "1" among the i- or j-bit binary data respectively, a column or row thermometer code data generating circuit for generating the column or row bit thermometer code data activated as "1" when a corresponding intermediate data bit of the column or row bit data are activated, wherein each bit of the column or row bit thermometer code data is additionally activated by the column or row bit data activated by i- or j-bit binary data having the lowest value among i- or j-bit binary data whose $y^{th}$ bit does not participate in activating corresponding bit of the column or row bit data and is activated as "1" among bits which are higher-order than an $x^{th}$ bit that participates in activating the corresponding bit of the column or row bit data, and a column or row reset circuit for periodically resetting the column or row thermometer code data to "0" in response to an external clock signal, and wherein when bits of higher-order than the $y^{th}$ bit participate in activating the corresponding bit of the column or row bit of data, the binary data whose $y^{th}$ bit does not participate in activating corresponding bit of the column or row bit data and is activated as "1" indicates binary data having a higher-order bit of "1" that participates in the activation.

16. The digital-to-analog converter according to claim 15, wherein the column data combining circuit comprises $(2^i-1)$ column sub-combination circuits for each outputting a corresponding bit among the $1^{st}$ through $(2^i-1)^{th}$ bits of column data.

17. The digital-to-analog converter according to claim 16, wherein each of the $(2^i-1)$ column sub-combination circuits comprises a buffer for buffering and outputting the corresponding bit of the column bit data.

18. The digital-to-analog converter according to claim 15, wherein the column thermometer code generating circuit comprises $(2^i-1)$ column sub-generating circuits for outputting a corresponding bit among the $1^{st}$ through $(2^i-1)^{th}$ column bit thermometer code data, and each of the $(2^i-1)$ column sub-generating circuits comprises at least one PMOS transistor connected between an output terminal for the corresponding bit of the column thermometer code data and a power supply voltage terminal and having a gate for receiving a bit of the column bit data to activate the corresponding bit of the column thermometer code data as "1".

19. The digital-to-analog converter according to claim 18, wherein each column sub-generating circuit comprises at least one dummy PMOS transistor to make the total number of PMOS transistors thereof equal to i when the number of PMOS transistors provided in each sub-generating circuit is less than i, and each dummy PMOS transistor is connected between the power supply voltage terminal and the output terminal for the corresponding bit of the thermometer code data and comprises a gate to receive a power supply voltage.

20. The digital-to-analog converter according to claim 15, wherein the row data combining circuit comprises $(2^j-1)$ row sub-combination circuits for each outputting a corresponding bit among the $1^{st}$ through $(2^j-1)^{th}$ bits of row data.

21. The digital-to-analog converter according to claim 20, wherein each of the $(2^j-1)$ row sub-combination circuits comprises a buffer for buffering and outputting the corresponding bit of the row bit data.

22. The digital-to-analog converter according to claim 15, wherein the row thermometer code generating circuit comprises $(2^j-1)$ row sub-generating circuits for outputting a corresponding bit among the $1^{st}$ through $(2^j-1)^{th}$ row bits of thermometer code data, and each of the $(2^j-1)$ row sub-generating circuits comprises at least one PMOS transistor connected between an output terminal for the corresponding bit of the row thermometer code data and a power supply voltage terminal and having a gate for receiving a bit of the row bit data to activate the corresponding bit of the row thermometer code data as "1".

23. The digital-to-analog converter according to claim 22, wherein each row sub-generating circuit comprises at least one dummy PMOS transistor to make the total number of PMOS transistors thereof equal to j when the number of PMOS transistors provided in each sub-generating circuit is less than j, and each dummy PMOS transistor is connected between the power supply voltage terminal and the output terminal for the corresponding bit of the thermometer code data and comprises a gate to receive a power supply voltage.

24. The digital-to-analog converter according to claim 15, wherein each of the first and second data-converting circuits further comprises a column or row output part to buffer and output the respective bits of the column or row thermometer code data.

25. The digital-to-analog converter according to claim 15, wherein the current cell array comprises a plurality of current cells, each current cell comprising:

a decoding part for outputting a selection signal and an inverted selection signal in response to a corresponding bit of the column or row thermometer code data and a corresponding bit for an adjacent current cell among the row thermometer code data;

a latch part for latching the selection signal and the inverted selection signal in response to an external clock signal, and outputting an inverted control signal and a control signal; and an output part for outputting an output signal and an inverted output signal having set current values in response to the inverted control signal and the control signal.

26. The digital-to-analog converter according to claim 25, wherein the decoding part comprises:

a logic circuit for activating the selection signal when the corresponding bit among the column or row thermometer code data is activated in the case that the bit corresponding to the adjacent current cell among the row thermometer code data is activated; and an output circuit for buffering and outputting the selection signal, and outputting the inverted selection signal by inverting the selection signal.

27. The digital-to-analog converter according to claim 25, wherein the latch part comprises:

a switch circuit for transmitting the selection signal and the inverted selection signal in response to the clock signal; and a latch circuit for outputting the inverted control signal and the control signal by latching the selection signal and the inverted selection signal transmitted from the switch circuit.

28. The digital-to-analog converter according to claim 25, wherein the output part comprises:

a bias current output circuit for outputting a bias current; and an output circuit for outputting the bias current through an output terminal for the output signal in response to the inverted control signal, and outputting the bias current through an output terminal for the inverted output signal in response to the control signal.

* * * * *